(12) United States Patent
Palmer (10) Patent No.: US 11,295,806 B2
(45) Date of Patent: Apr. 5, 2022

(54) LARGE FILE INTEGRITY TECHNIQUES

(71) Applicant: Micron Technology, Inc., Boise, ID (US)

(72) Inventor: David Aaron Palmer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 31 days.

(21) Appl. No.: 16/554,247

(22) Filed: Aug. 28, 2019

(65) Prior Publication Data

US 2021/0065768 A1  Mar. 4, 2021

(51) Int. Cl.
| G11C 11/409 | (2006.01) |
| G06F 12/02 | (2006.01) |
| G06F 12/14 | (2006.01) |
| G06F 3/06 | (2006.01) |

(52) U.S. Cl.
CPC ............ *G11C 11/409* (2013.01); *G06F 3/064* (2013.01); *G06F 3/0619* (2013.01); *G06F 3/0643* (2013.01); *G06F 3/0679* (2013.01); *G06F 12/0246* (2013.01); *G06F 12/1408* (2013.01); *G06F 2212/7201* (2013.01)

(58) Field of Classification Search
CPC .... G06F 3/064; G06F 3/0463; G06F 12/1408; G06F 2212/7201; G11C 11/409
USPC .................................................... 365/189.11
See application file for complete search history.

(56) References Cited

U.S. PATENT DOCUMENTS

| 7,610,433 | B2 | 10/2009 | Randell et al. |
| 2013/0297894 | A1 | 11/2013 | Cohen et al. |
| 2015/0143035 | A1 | 5/2015 | Choi et al. |
| 2017/0192902 | A1* | 7/2017 | Hwang ............... G06F 12/0246 |
| 2018/0239711 | A1* | 8/2018 | Hanson ............... G06F 12/0246 |
| 2019/0294376 | A1* | 9/2019 | Park ......................... G06F 3/064 |
| 2020/0042242 | A1* | 2/2020 | Byun ...................... G06F 3/064 |

\* cited by examiner

*Primary Examiner* — Anthan Tran
(74) *Attorney, Agent, or Firm* — Schwegman Lundberg & Woessner, P.A.

(57) ABSTRACT

Devices and techniques are disclosed herein for more efficiently exchanging large amounts of data between a host and a flash storage system. In an example, read commands or write commands can optionally include a file-type indicator. The file-type indicator can allow for exchange of data between the host and the flash storage system using a single record of a Flash Translation Layer (FTL) table or logical-to-physical (L2P) table, and where the amount of data can be much larger than the atomic unit associated with the flash storage system.

15 Claims, 5 Drawing Sheets

LARGE FILE INTEGRITY TECHNIQUES

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Flash memory based storage devices such as NAND memory can use a Flash Translation Layer (FTL) to translate logical addresses of I/O requests, often referred to as logical block addresses (LBAs), to corresponding flash memory addresses which are stored in one or more FTL mapping tables. LBAs can be the logical addresses used by a host for managing data. Mobile storage devices typically have a cache with constrained size, and thus often lack memory to store an entire mapping table. Therefore, portions of the mapping table(s) can be retrieved from the flash memory on demand, which can cause random read performance degradation.

In order to improve random read performance, techniques described herein enable use of host-resident memory, in addition to memory cells of a memory device coupled to the host, as a cache for a FTL mapping table. Under a host-resident FTL, FTL data can be read from host memory faster than from flash memory, and the host can initiate a memory operation by retrieving a physical address (PA) of the flash memory and including the PA in a memory request to the flash memory. The PA can be retrieved by the host using the FTL memory cache of the host and the LBA of the host. Upon receiving the memory request, the flash memory system can immediately retrieve the data associated with the physical address without the delay associated with accessing the flash memory-based mapping table and using the LBA to obtain the physical address.

In certain implementations of a host-resident FTL, improvements in random read workload performance can be significant. However, the improvements in accelerated read capabilities are currently limited to single LBA chunks because managed flash storage devices do possess processing capabilities that facilitate files or other collections of related data. For example, when the host commands data to be stored in the flash storage device, the host can provide a write command with a logical block address and an amount of data. Currently the flash storage device, even those flash storage devices employing host-based FTL systems, store the amount of data in an atomic units. Therefore, as an example, and not by way of limitation, for a system that has an atomic unit of 4 k, a write command configured to store 64 k of data will result in 16 4 k chucks of that data being individually stored on the flash memory of the flash storage device. As such, for given host file, the data stored on the flash storage device may not be programmed sequentially into the flash memory of the flash storage device. Therefore, even with host-based FTL capabilities, when the host wishes to read a large file, multiple individual read commands, each with an LBA or physical address are provided to the flash storage device for each atomic chuck of data of the large file of the host. The present inventor has recognized techniques to further improve exchange of data between a host and a flash storage device where the data his larger than the atomic size of the system and can be beneficial for overall performance, and for the data to be sequentially stored on the flash memory system.

Figure 1:
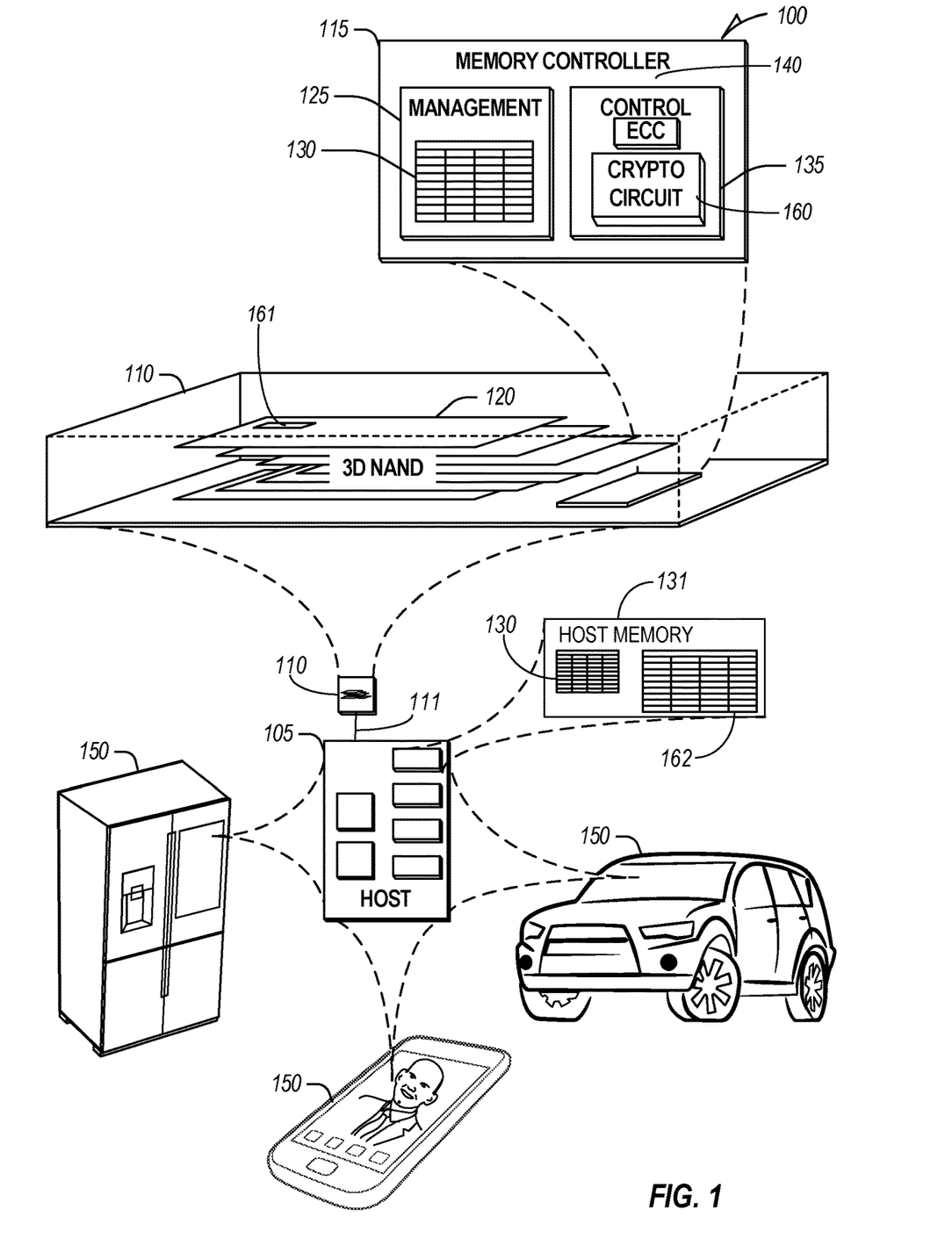
FIG. 1 illustrates an example of an environment including a host and a memory device configured to communicate over a communication interface.

FIG. 1 illustrates an example of an environment 100 including a host 105 and a memory device 110 configured to communicate over a communication interface. The host 105 or the memory device 110 may be included in a variety of products 150, such as IoT devices (e.g., a refrigerator or other appliance, sensor, motor or actuator, mobile communication device, automobile, mobile phone, drone, etc.) to support processing, communications, or control of the product 150.

The memory device 110 includes a memory controller 115 and a memory array 120 including, for example, one or more individual memory die (e.g., a stack of three-dimensional (3D) NAND die). In 3D architecture semiconductor memory technology, vertical structures are stacked in multiple tiers, and coupled to form physical pages, to increase the storage density of a memory device (e.g., a storage device) in a given footprint (i.e. form factor). In an example, the memory device 110 can be a discrete memory device. In certain examples, one or more memory die of the memory array 120 can include a first complete FTL table 161 for mapping logical block addresses of the host with physical addresses of the flash memory.

One or more communication interfaces 111 can be used to transfer data between the memory device 110 and one or more other components of the host 105, such as a Serial Advanced Technology Attachment (SATA) interface, a Peripheral Component Interconnect Express (PCIe) interface, a Universal Serial Bus (USB) interface, a UFS interface, an eMMCT™ interface, or one or more other connectors or interfaces. The host 105 can include a host system, an electronic device, a processor, a memory card reader, or one or more other electronic devices external to the memory device 110. In some examples, the host 105 may be a machine having some portion, or all, of the components discussed in reference to the machine 500 of FIG. 5. Data may be transferred between the memory device 110 and other components over an input/output (I/O) bus that may include one or more latches for temporarily storing the data as it is being transferred (e.g., before being read or written from/to a memory array).

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, control circuitries, or components configured to control access across the memory array 120 and to provide a translation layer between the host 105 and the memory device 110. The memory controller 115 can include one or more I/O circuits (and corresponding latches), caches, lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. ECC component 140, for example, may detect or compute a bit-error-rate (BER) associated with performing a number of memory operations. The BER may correspond to bit errors occurring in latches of an I/O bus, internal errors of memory controller 115, errors occurring in one or more of the NAND arrays, or any one or more of the multi-level cell(s) (MLC) of the memory device 110. The memory controller 115 can be configured to actively detect and recover from error occurrences (e.g., bit errors, operation errors, crash conditions, stalls, hang ups, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. Array controller 135 may transmit detected BER information to memory manager 125 for storage and tracking. The memory controller 115 may include a command queue (not shown) that tracks memory commands received from a host. Commands in the queue may be executed by memory controller 115 in a first-in first-out (FIFO) manner, stack manner, out of sequence, according to priority, or in any other suitable order.

The described memory device 110 includes cryptography circuitry 160 in association with the memory array 120. In certain examples, the cryptography circuitry 160 can include an encryption circuit, a decryption circuit, or a combination thereof. In some implementations, memory controller 115 of memory device 110 may include control circuitry configured to implement the functions of the cryptography circuit 160. In other implementations, the cryptography circuit 160 may include an independent control circuitry for implementing the described functionality. In yet other implementations, control circuitry may be divided between the cryptography circuit 160 and memory controller 115 to implement the described functions of the cryptography circuit 160. In the depicted example, the array controller 135 forms a portion of the memory controller 115, and the cryptography circuit 160 forms a portion of the array controller. In other implementations, cryptography circuit 160 may be external, and/or outside of array controller 135. For example, the cryptography circuit 160 (or any individual components thereof), may be an independent component coupled to one or more components in environment 100. However physically located, the structures providing the additional functionality of the cryptography circuit 160, function to verify physical addresses provided by the host 105 to prevent erroneous or malicious access to the memory device and to provide opportunities for the host to refresh the host-resident mapping table information to align the mapping information with the mapping information of the memory device during host-resident FTL operation of the environment 100.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection (e.g., BER monitoring) or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory array 120 can include multiple memory cells arranged in, for example, a number of devices, planes, sub-blocks, blocks, or pages. As one example, a 48 GB TLC NAND memory device can include 18,592 bytes of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory device 110 in pages and erased in blocks. However, one or more memory operations (e.g., read, write, erase, etc.) can be performed on larger or smaller groups of memory cells, as desired. The data transfer size of a memory device 110 is typically referred to as a page, whereas the data transfer size of a host is typically referred to as a sector.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a MLC NAND flash device may have a higher bit error rate than a corresponding single-level cell (SLC) NAND flash device. As such, the MLC device may require more metadata bytes for error data than the corresponding SLC device.

In certain examples, the host can include second memory 111. The second memory 111 is not a flash-type memory device. In certain examples, the second memory 111 can be used to store and maintain a set of management tables 130. The management tables can include various information associated with one or more components of the memory device 110 (e.g., various information associated with a memory array or one or more memory cells coupled to the memory controller 115 and can include an FTL table). For example, the management tables 130 can include information regarding FTL mapping information, block age, block erase count, error history, error parameter information, host reset timeout value, memory operation command latencies, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things.

In certain examples, the second memory can include a second complete FTL table 162 for mapping logical block addresses of the host with physical addresses of the flash memory. In some examples, the environment 100 may include only one of the first complete FTL table 162, or the second complete FTL table 162.

As discussed above, the present inventor has recognized that current accelerated read techniques for flash memory systems only work on single atomic chunks. Inefficiencies can exist because the LBAs for a given sequential read may not have been written sequentially by the controller of the flash memory device. Therefore, conventional flash memory systems, including those implementing a host-based FTL, supply a separate physical address for each atomic chunk of data. Such tedious and repetitive techniques can introduce substantial latency and power usage for a large sequential reads (e.g., up to 512 KB=128 LBAs for mobile, larger for other workloads).

Figure 2:
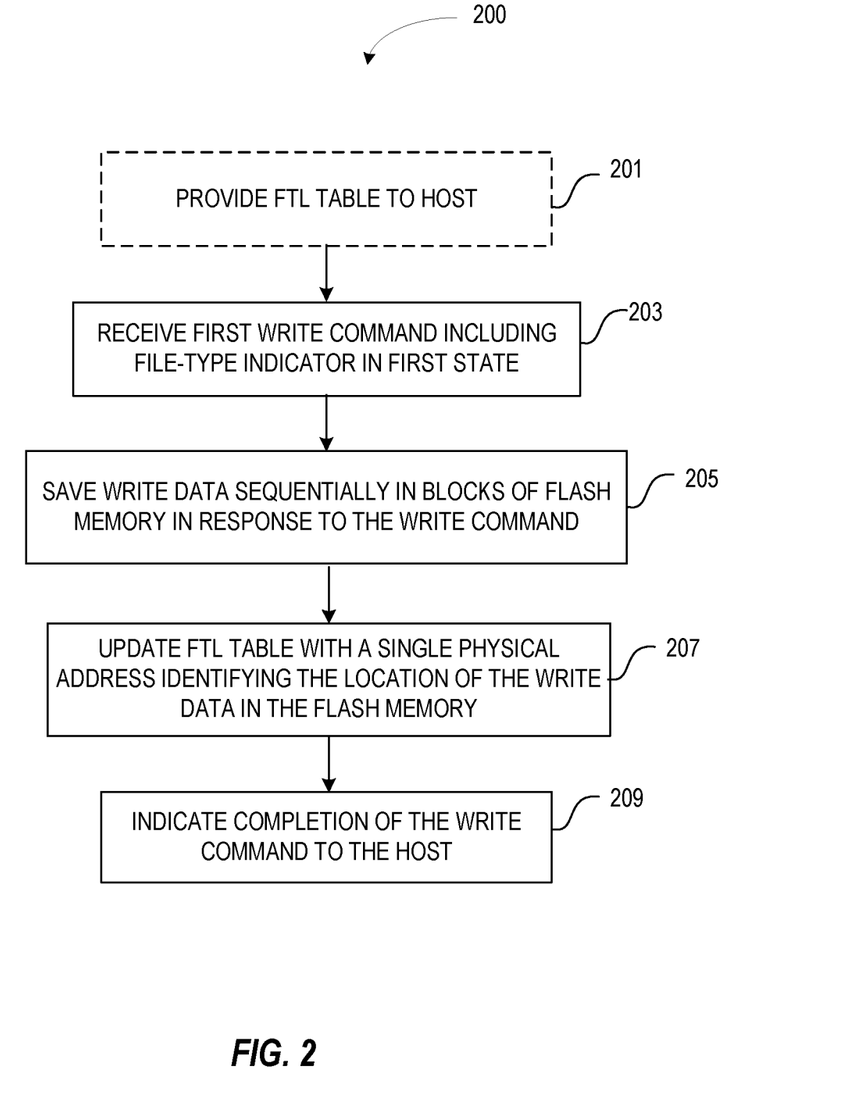
FIG. 2 illustrates generally a flowchart of an example method of improving exchange of large amounts of data intended to be stored in a flash memory storage device, and read back from the flash storage device, sequentially.

FIG. 2 illustrates generally a flowchart of an example method 200 of improving exchange of large amounts of data intended to be stored in a flash memory storage device, and read back from the flash storage device, sequentially. At 201, the flash storage system can optionally provide an FTL table, or L2P table, to the host device. Providing the FTL table to the host allows the host to manage some aspects of the flash storage device. With the FTL table, the host device can provide commands that include a physical address which, in certain examples, can assist in reducing latency associated with translating a LBA of the host with a corresponding physical address of the flash storage system. In certain examples, the host device can be much faster at using the FTL table than the flash storage system. In some examples, at least the physical addresses of the FTL table can be encrypted. At 203, the flash storage system can receive a write command. The write command can include write information such as an LBA, a physical address, or both an LBA and a physical address. The write command may or may not include the write data or a portion of the write data.

The write command or the write information can include a file-type indicator or flag. When the file-type indicator is in a first state, the host is indicating that the write data is to be processed differently than when the file type indicator is in a second state. If the file type indicator is in the second state, the write data can be stored according to conventional methods where the data is stored in individual blocks without regard to other write data associated with the write command. As used herein with regard to FIGS. 2-4, a block of flash memory is the atomic, or smallest, size of memory the flash storage system uses for write commands. and each atomic unit is associated with a record in the FTL table that maps an LBA of the host device with a physical address of the flash storage system.

At 205, when the file-type indicator is in the first state, the flash storage system stores the data sequentially in the flash memory of the flash storage system. In certain examples, the file-type indicator can be stored at the flash storage system, in other examples, it is not. At 207, the FTL table can be updated using a single record with a single physical address to identify the location of the write data within the flash memory instead of using a number of records to identify each block used for the write data. At 209, after the data is programmed to the flash memory, the flash storage system can optionally return a physical address indicative of a starting address of the sequential write data. In some examples, the physical address is the same physical address provided in the command. In some examples, even if a physical address was provide with the write command, the physical address returned to the host upon completion of the write command may be different due to maintenance of the flash memory system that may not have been reflected in the FTL table of the host. In certain examples, any one or more of the physical addresses provided to the host can be encrypted versions of a physical address, for example, to prevent malicious tampering of the overall system or portions thereof. In certain examples, within the FTL table, the write command associates a single record or physical address with the entire volume of the write data associated with the write command when the file type indicator is in the first state.

Figure 3:
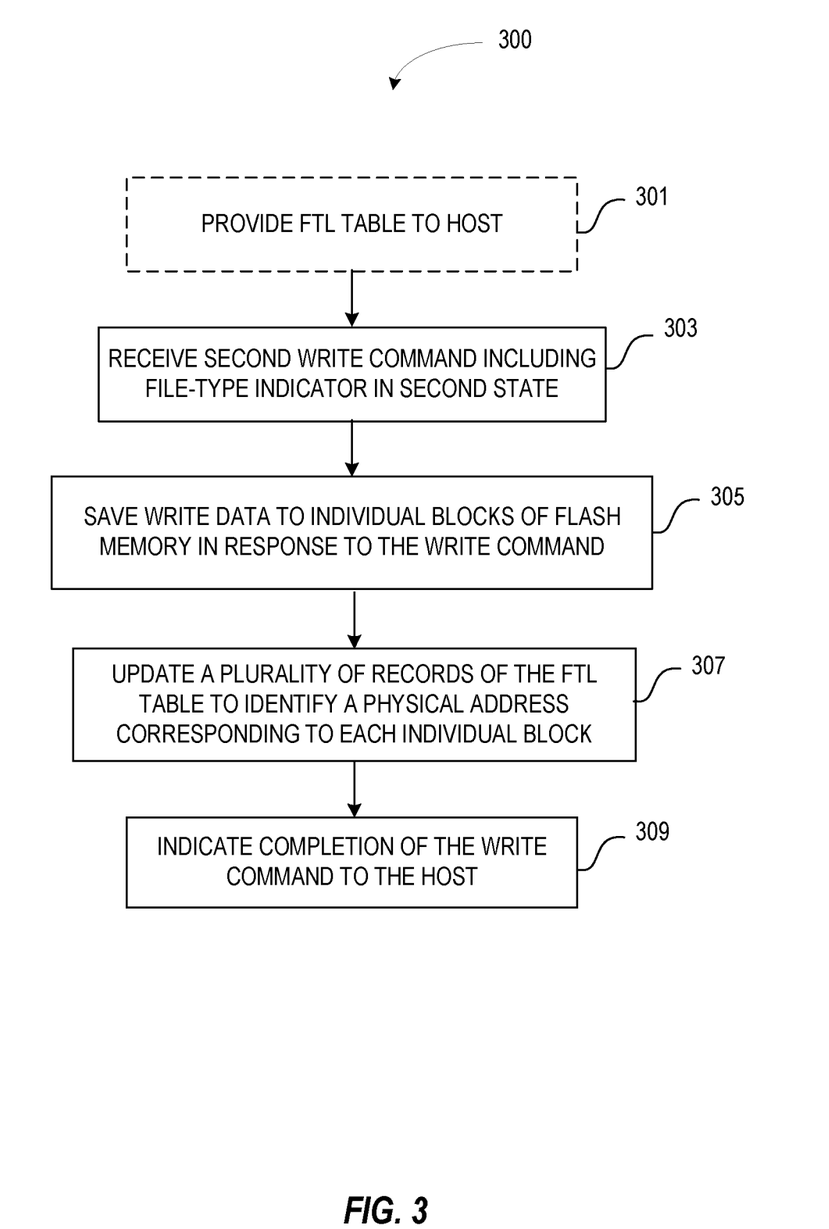
FIG. 3 illustrates generally a flowchart of an example method of receiving and executing a write command having a file-type indicator in a second state.

FIG. 3 illustrates generally a flowchart of an example method of receiving and executing a write command having a file-type indicator in a second state. At 301, the flash storage system can optionally provide an FTL table, or L2P table, to the host device. Providing the FTL table to the host allows the host to manage some aspects of the flash storage device. With the FTL table, the host device can provide commands that include a physical address of the flash memory of the flash storage system which, in certain examples, can assist in reducing latency associated with translating a LBA of the host with a corresponding physical address of the flash storage system. In certain examples, the host device can be much faster at using the FTL table than the flash storage system. In some examples, at least the physical addresses of the FTL table can be encrypted. At 303, the flash storage system can receive a write command. The write command can include write information such as an LBA, a physical address, or both an LBA and a physical address. The write command may or may not include the write data or a portion of the write data.

The write command or the write information can include file-type indicator in a second state. When the file type indicator is in the second state, the write data can be stored in the flash storage system according to conventional methods where the data is stored in individual blocks without regard to other write data associated with the write command. As used herein with regard to FIGS. 2 and 3, a block of flash memory is the atomic, or smallest, size of flash memory the flash storage system uses for write commands.

At 305, the flash storage system stores or writes the write data to individual blocks of the flash memory. In certain examples, the file-type indicator can be stored at the flash storage system, in other examples, it is not. At 307, FTL table information can be updated using a plurality of records to identify a physical address corresponding to each individual block receiving a portion of the write data. At 309, after the data is programmed to the flash memory, the flash storage system can optionally return information indicating execution of the write command is complete. In certain examples, any one or more of the physical addresses provided to the host can be encrypted versions of a physical address, for example, to prevent malicious tampering of the overall system or portions thereof.

Figure 4:
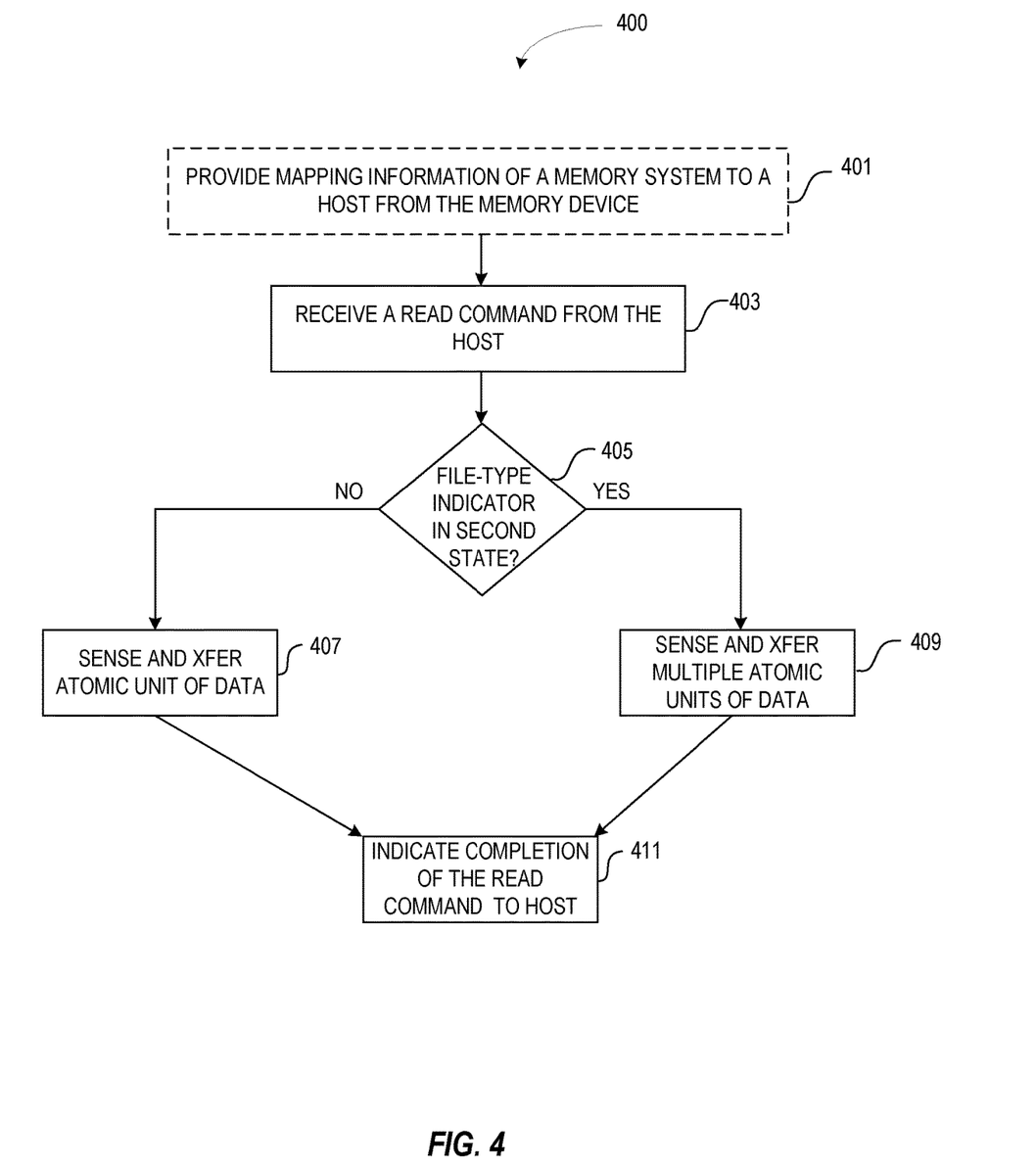
FIG. 4 illustrates generally a flowchart of an example method of improving read command performance of a flash storage system.

FIG. 4 illustrates generally a flowchart of an example method of improving read command performance of a flash storage system. At 401, the flash storage system can optionally provide an FTL table, or L2P table, to the host device. Providing the FTL table to the host allows the host to manage some aspects of the flash storage device. With the FTL table, the host device can provide commands that include a physical address of the flash memory of the flash storage system which, in certain examples, can assist in reducing latency associated with translating a LBA of the host with a corresponding physical address of the flash storage system. In certain examples, the host device can be much faster at using the FTL table than the flash storage system. In some examples, at least the physical addresses of the FTL table can be encrypted. At 403, the flash storage system can receive a read command. In certain examples, the read command can include read information such as an LBA, a physical address, or both an LBA and a physical address. In some examples, the read command can include a file-type indicator. In some examples, the file-type indicator can be saved within a first portion of the read data such as in a block associated with the physical address received with the read command or in the physical address associated with LBA received with the read command. In some examples, a file-type indicator is not received with the read command and is not saved with the read data.

As determined at 405, when the file type indicator is in a first read state, or the read command or read data does not include a file-type indicator, the read data can be retrieved from the flash storage system according to conventional methods at 407. Such methods can include the flash memory system receiving a read command for each atomic unit of read data requested by the host. Thus, when the host desires to access a large file stored on the flash memory system, without using the new techniques discussed herein, the exchange of the data of that large file can include multiple read request commands being received at the flash memory system. Each command may include either the host or the flash storage system accessing the FTL table to determine a corresponding physical address for each block, or atomic unit, of flash memory to be read.

As determined at 405, when the file type indicator is in a second read state, at 409, multiple atomic units of read data can be retrieved from the flash storage system. In certain examples, read data received with the command or read data retrieved from a first block of read data can indicate the amount of data to be read. In some examples, a single LBA, or a corresponding single physical address, can indicate a starting point to begin sensing the multiple sequential blocks of flash memory data. The LBA or physical address can be received with the read command. In some examples, the physical address can be retrieved from the L2P table. In certain examples, the file-type indicator can allow for large amounts of data to be transferred between the host and flash storage system with a single read or write command, or to be referenced in the L2P table with a single record, and thus, reduce latency associated with storing and retrieving files of host data that are larger than the atomic unit of the overall system.

At 411, the flash storage system can indicate completion of the read command to the host system. In certain examples, where the file-type indication is in the first state, or a file-type indication is not available, additional read commands can be received at the flash storage system to retrieve additional atomic units of the desired read data. The additional read commands can provide an additional LBA or physical address for each additional atomic unit of data. In certain examples, an indication of completion of the read command can include the LBA or physical address associated with the read data, or an encrypted version of the LBA or the physical address.

Figure 5:
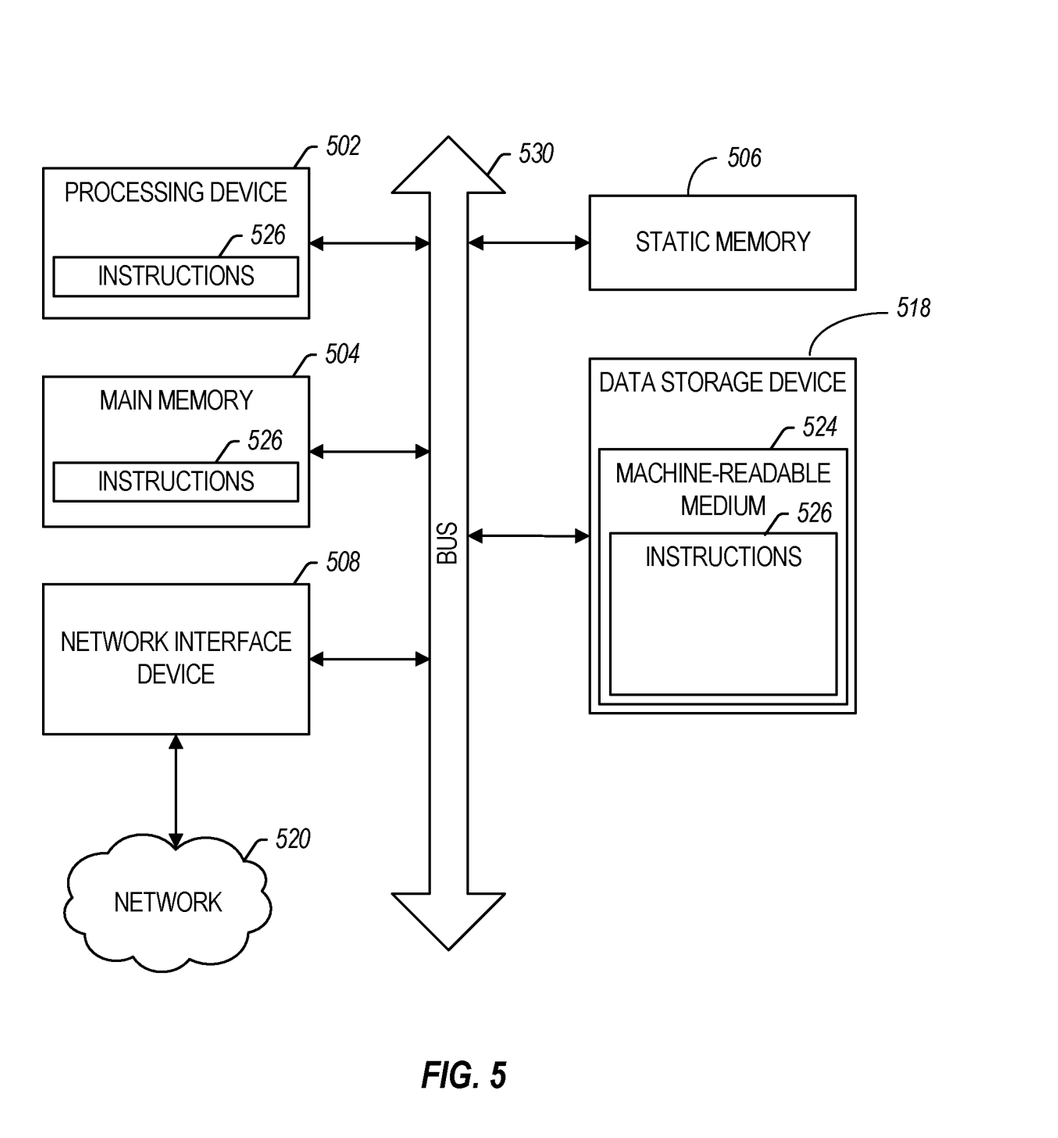
FIG. 5 illustrates a block diagram of an example machine 500 upon which any one or more of the techniques (e.g., methodologies) discussed herein may perform.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host 105, the memory device 110, etc.) may include a processing device 502 (e.g., a hardware processor, a central processing unit (CPU), a graphics processing unit (GPU), a hardware processor core, or any combination thereof, such as a memory controller of the memory device 110, etc.), a main memory 504 (e.g., read-only memory (ROM), flash memory, dynamic random-access memory (DRAM) such as synchronous DRAM (SDRAM) or Rambus DRAM (RDRAM), etc.), a static memory 506 (e.g., flash memory, static random-access memory (SRAM), etc.), and a data storage system 518, some or all of which may communicate with each other via an interlink (e.g., bus) 530.

The processing device 502 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 can be configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 or within the processing device 502 during execution thereof by the computer system 500, the main memory 504 and the processing device 502 also constituting machine-readable storage media. The machine-readable storage medium 524, the data storage system 518, or the main memory 504 can correspond to the memory device 110 of FIG. 1.

In one implementation, the instructions 526 include instructions to implement functionality corresponding to one or more optional host-resident FTL operations discussed above with respect to FIG. 2, FIG. 3, or FIG. 4. While the machine-readable storage medium 524 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 500 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 500 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 526 (e.g., software, programs, an operating system (OS), etc.) or other data are stored on the data storage device 518 can be accessed by the main memory 504 for use by the processing device 502. The main memory 504 (e.g., DRAM) is typically fast, but volatile, and thus a different type of storage than the data storage device 518 (e.g., an SSD), which is suitable for long-term storage, including while in an "off" condition. The instructions 526 or data in use by a user or the machine 500 are typically loaded in the main memory 504 for use by the processing device 502. When the main memory 504 is full, virtual space from the data storage device 518 can be allocated to supplement the main memory 504; however, because the data storage device 518 device is typically slower than the main memory 504, and write speeds are typically at least twice as slow as read speeds, use of virtual memory can greatly reduce user experience due to storage device latency (in contrast to the main memory 504, e.g., DRAM). Further, use of the data storage device 518 for virtual memory can greatly reduce the usable lifespan of the data storage device 518.

In contrast to virtual memory, virtual memory compression (e.g., the Linux™ kernel feature "ZRAM") uses part of the memory as compressed block storage to avoid paging to the data storage device 518. Paging takes place in the compressed block until it is necessary to write such data to the data storage device 518. Virtual memory compression increases the usable size of the main memory 504, while reducing wear on the data storage device 518.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 524 may further be transmitted or received over a network 520 using a transmission medium via the network interface device 508 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 508 may include one or more physical jacks (e.g., Ethernet, coaxial, or phone jacks) or one or more antennas to connect to the network 520. In an example, the network interface device 508 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 500, and includes digital or analog communications signals or other intangible medium to facilitate communication of such software.

ADDITIONAL NOTES AND EXAMPLES

Example 1 is a method comprising: providing mapping table information to a host from a flash storage system; receiving a first write command from the host at the flash storage system, wherein the first write command includes, a first logical block address of the host, first write data and a file-type flag in a first file-type state; and executing a first write operation configured to store the first write data in a plurality of sequential blocks of flash memory of the flash storage system starting at a first block of the flash memory having a first physical address.

In Example 2, the subject matter of Example 1 includes, returning a representation of a physical address to the host in response to the first write command.

In Example 3, the subject matter of Example 2 includes, wherein the representation of the physical address includes an encrypted form of the physical address.

In Example 4, the subject matter of Examples 2-3 includes, wherein returning a representation of the physical address to the host in response to the first write command includes providing second mapping table information of the write command to the host from the flash storage system.

In Example 5, the subject matter of Examples 1-4 includes, receiving a second write command from the host at the flash storage system, wherein the second write command includes a second logical block address of the host, second write data and the file-type flag indicating a second file type; and executing a second write operation configured to store the second write data in a single block of flash memory of the flash storage system starting at a second block of the flash memory having a second physical address.

In Example 6, the subject matter of Example 5 includes, returning a representation of the second physical address to the host in response to the second write command.

In Example 7, the subject matter of Example 6 includes, wherein the second representation of the second physical address includes an encrypted form of the second physical address.

In Example 8, the subject matter of Examples 6-7 includes, wherein returning a representation of the second physical address to the host in response to the second write command includes providing mapping table information of the second write command to the host from the flash storage system.

In Example 9, the subject matter of Examples 1-8 includes, receiving a first read command from the host at the flash storage system, wherein the first read command includes first read information; determining a first portion of the first read information includes a read file-type flag in the first file-type state; and reading and sending multiple sequential blocks of data from the flash storage system to the host in response to the read command, wherein a first block of the multiple blocks is at a physical address associated with the first read information.

In Example 10, the subject matter of Examples 1-9 includes, wherein the flash storage system includes NAND flash memory.

Example 11 is a storage system comprising: flash memory configured to store data of a host device; a flash memory control circuit configured to interface to the host device and to the flash memory; and wherein the flash memory control circuit is configured to: provide mapping table information to a host from the storage system; receive a first write command from the host at the storage system, wherein the first write command includes, a representation of a first physical address of the flash memory, first write data and a file-type flag in a first file-type state; and execute a first write operation configured to store the first write data in a plurality of sequential blocks of the flash memory beginning at a first block of the flash memory having the first physical address.

In Example 12, the subject matter of Example 11 includes, wherein the flash memory control circuit is configured to return a second representation of the first physical address to the host in response to the first write command.

In Example 13, the subject matter of Example 12 includes, wherein the representation of the first physical address and the second representation of the first physical address is an encrypted version of the first physical address.

In Example 14, the subject matter of Examples 11-13 includes, wherein the flash memory control circuit is configured to: receive a second write command from the host at the storage system, wherein the second write command includes a third representation of a second physical address, second write data and the file-type flag indicating a second file type; and execute a second write operation configured to store the second write data in a single block of the flash memory beginning at a second block of the flash memory having the second physical address.

In Example 15, the subject matter of Examples 11-14 includes, wherein the flash memory control circuit is configured to: receive a first read command from the host, wherein the first read command includes first read information provided and a second representation of a second physical address; determine a first portion of the first read information includes a read file-type flag in the first file-type state; and sense and send multiple sequential blocks of data from the storage system to the host in response to the read command, wherein a first block of the multiple blocks is at the second physical address.

Example 16 is a machine-readable medium, comprising instructions, which when executed by a processor of a flash memory system, cause the processor to perform operations comprising: receiving a first write command from a host at the flash memory system, wherein the first write command includes, first write information, first write data and a file-type indicator; when the file type indicator is in a first state, selectively executing a first write operation to program the first write data in a plurality of sequential blocks of flash memory of the flash memory system in response to receiving the first write command; and when the file type indicator is in a second state, selectively executing the first write operation to program the first write data in a single block of flash memory of the flash memory system in response to receiving the first write command.

In Example 17, the subject matter of Example 16 includes, wherein the write information includes an encrypted representation of a physical address of the flash memory system.

In Example 18, the subject matter of Examples 16-17 includes, wherein the operations include sending a map table of the flash memory system to host, wherein the map table includes a plurality of records, each record including a logical block address of the host and a corresponding representation of a physical address of the flash memory system.

In Example 19, the subject matter of Examples 16-18 includes, wherein the operations include: receiving a second write command from the host at the flash memory system, wherein the second write command includes a second logical block address of the host, second write data and the file-type indicator indicating a second file type; and executing a second write operation configured to store the second write data in a single block of flash memory of the flash memory system starting at a second block of the flash memory having a second physical address.

In Example 20, the subject matter of Example 19 includes, wherein operations include: receiving a first read command from the host at the flash memory system, wherein the first read command includes first read information provided to the host from the flash memory system; determining a first portion of the first read information includes the file-type indicator in the first state; and determining a second portion of the read information includes a representation of a physical address reading and sending multiple sequential blocks of data from the flash memory system to the host in response to the read command, wherein a first block of the multiple blocks is at the physical address.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method, comprising:
providing mapping table information to a host from a flash storage system;
receiving a first write command from the host at the flash storage system, wherein the first write command includes a first logical block address of the host, first write data, and a file-type flag in a first file-type state;
in response to the rust file-type state of the file-type flag, determining that the first write data is to be stored in multiple sequential physical memory blocks from a starting first physical address;
executing a first write operation configured to store the first write data in the multiple sequential physical memory blocks of the flash storage system starting at the first physical address; and
updating the mapping table to include a single record mapping the first logical block address with the multiple physical memory blocks.

2. The method of claim 1, including returning a representation of the first physical address to the host in response to the first write command.

3. The method of claim 2, wherein the representation of the first physical address includes an encrypted form of the first physical address.

4. The method of claim 2, wherein returning a representation of the first physical address to the host in response to the first write command includes providing second mapping table information of the first write command to the host from the flash storage system.

5. The method of claim 1, including:
receiving a second write command from the host at the flash storage system, wherein the second write command includes a second logical block address of the host, second write data and the file-type flag indicating a second-file type; and
executing a second write operation configured to store the second write data at one or more physical addresses of flash memory of the flash storage system including a second physical address.

6. The method of claim 5, including returning a representation of the second physical address to the host in response to the second write command.

7. The method of claim 6, wherein the second representation of the second physical address includes an encrypted form of the second physical address.

8. The method of claim 6, wherein returning a representation of the second physical address to the host in response to the second write command includes providing mapping table information of the second write command to the host from the flash storage system.

9. The method of claim 1, including:
receiving a first read command from the host at the flash storage system, wherein the first read command includes first read information;
determining a first portion of the first read information includes a starting logical or physical block address, and a read file-type flag in the first file-type state; and
reading and sending sequential physically stored data from the flash storage system to the host in response to the read command, wherein the sequentially physically stored data starts at a physical address associated with the first read information.

10. The method of claim 1, wherein the flash storage system includes NAND flash memory.

11. A storage system comprising:
flash memory configured to store data of a host device;
a flash memory control circuit configured to interface to the host device and to the flash memory; and
wherein the flash memory control circuit is configured to:
provide mapping table information to a host from the storage system;
receive a first write command from the host at the storage system, wherein the first write command includes a representation of a first physical address of the flash memory, first write data, and a file-type flag in a first file-type state;
in response to the first file-type state of the file-type flag, determining that the first write data is to be stored in multiple sequential physical memory blocks from a starting first physical address;
executing a first write operation configured to store the first write data in the multiple sequential physical memory blocks of the flash storage system starting at the first physical address; and
updating the mapping table to include a single record mapping the first logical block address with the multiple physical memory blocks.

12. The storage system of claim 11, wherein the flash memory control circuit is configured to return a second representation of the first physical address to the host in response to the first write command.

13. The storage system of claim 12, wherein the second representation of the first physical address is an encrypted version of the first physical address.

14. The storage system of claim 11, wherein the flash memory control circuit is configured to:
receive a second write command from the host at the storage system, wherein the second write command includes a third representation of a second physical address, second write data, and the file-type flag indicating a second file-type; and
execute a second write operation configured to store the second write data at one or more physical addresses of the flash memory including a second physical address.

15. The storage system of claim 11, wherein the flash memory control circuit is configured to:
receive a rust read command from the host, wherein the first read command includes rust read information and a second representation of a second physical address;
determine that a first portion of the first read information includes a read file-type flag in the first file-type state; and
read and send sequential physically stored data from the storage system to the host in response to the read command, wherein the sequentially physically stored data starts at a physical address associated with the first read information.

* * * * *